United States Patent
Bagnati et al.

(10) Patent No.: US 12,405,302 B2
(45) Date of Patent: Sep. 2, 2025

(54) INTEGRATED CIRCUIT WITH OFF-STATE DIAGNOSIS FOR DRIVER CHANNELS

(71) Applicant: STMICROELECTRONICS S.R.L., Agrate Brianza (IT)

(72) Inventors: Gaudenzia Bagnati, Pogliano Milanese (IT); Marzia Annovazzi, Buccinasco (IT); Diego Alagna, Milan (IT); Lucia Maggio, Munich (DE)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 190 days.

(21) Appl. No.: 17/678,763

(22) Filed: Feb. 23, 2022

(65) Prior Publication Data

US 2023/0266381 A1     Aug. 24, 2023

(51) Int. Cl.

| | |
|---|---|
| *G01R 31/28* | (2006.01) |
| *G01R 31/52* | (2020.01) |
| *G01R 31/54* | (2020.01) |
| *H03K 5/24* | (2006.01) |
| *H03K 17/687* | (2006.01) |
| *H03K 21/08* | (2006.01) |

(52) U.S. Cl.
CPC ........... *G01R 31/2851* (2013.01); *H03K 5/24* (2013.01); *H03K 17/6874* (2013.01); *H03K 21/08* (2013.01); *G01R 31/52* (2020.01); *G01R 31/54* (2020.01)

(58) Field of Classification Search
CPC .... G01R 31/2851; G01R 31/54; G01R 31/52; H03K 5/24; H03K 17/6874; H03K 21/08
See application file for complete search history.

(56) References Cited

U.S. PATENT DOCUMENTS

| | | | | |
|---|---|---|---|---|
| 4,875,448 | A | * | 10/1989 | Dykstra .............. F02D 35/0007 123/352 |
| 4,913,557 | A | * | 4/1990 | Segawa .......... G01R 31/318536 714/731 |
| 4,932,381 | A | * | 6/1990 | Rousseau ................ F02P 17/00 701/114 |
| 5,289,054 | A | | 2/1994 | Lucas |
| 5,469,094 | A | * | 11/1995 | Nessi ................... H03K 17/166 327/108 |
| 6,348,820 | B1 | | 2/2002 | Bennett et al. |
| 6,664,802 | B2 | | 12/2003 | Wimmer et al. |
| 9,336,704 | B2 | | 5/2016 | Li et al. |

(Continued)

OTHER PUBLICATIONS

Mouser Electronics, ST Life Augmented, Aug. 6, 2020, (Year: 2020).*

(Continued)

*Primary Examiner* — Lisa M Caputo
*Assistant Examiner* — Sharah Zaab
(74) *Attorney, Agent, or Firm* — Seed Intellectual Property Law Group LLP

(57) ABSTRACT

An integrated circuit includes a plurality of power transistor driver channels for driving external loads. The driver channels can be selectively configured as high side or low side driver channels. The integrated circuit includes, for each driver channel, a respective analog test circuit and a respective controller. The integrated circuit includes a single counter connected to each of the controllers for simultaneously controlling off-state diagnosis timing windows for the driver channels.

20 Claims, 8 Drawing Sheets

(56) References Cited

U.S. PATENT DOCUMENTS

| | | |
|---|---|---|
| 9,676,357 B2 | 6/2017 | Dittfeld et al. |
| 9,871,448 B2 | 1/2018 | Yan |
| 10,340,908 B2 * | 7/2019 | Baik ................ G01R 31/50 |
| 10,910,823 B2 | 2/2021 | Minagawa |
| 2004/0026997 A1 | 2/2004 | Kim |
| 2004/0227561 A1 * | 11/2004 | Balakrishnan ....... H03K 17/122 |
| | | 327/427 |
| 2009/0195190 A1 * | 8/2009 | Fong ................ H05B 45/382 |
| | | 315/307 |
| 2014/0184185 A1 * | 7/2014 | Torrisi ................ H02H 9/002 |
| | | 323/277 |
| 2017/0034886 A1 * | 2/2017 | Gangi ................ H05B 45/10 |
| 2018/0316182 A1 | 11/2018 | Minagawa |
| 2023/0266382 A1 | 8/2023 | Bagnati et al. |
| 2023/0266403 A1 | 8/2023 | Bagnati |

OTHER PUBLICATIONS

U.S. Appl. No. 17/678,772, filed Feb. 23, 2022.
U.S. Appl. No. 17/678,953, filed Feb. 23, 2022.

\* cited by examiner

INTEGRATED CIRCUIT WITH OFF-STATE DIAGNOSIS FOR DRIVER CHANNELS

BACKGROUND

Technical Field

The present disclosure is related to integrated circuits, and more particularly, to diagnostics for high side/low side driver channels.

Description of the Related Art

Some integrated circuits have dedicated driver channels for driving loads external to the integrated circuits. Each driver channel may have a power transistor having source and drain terminals coupled to dedicated output terminals of the integrated circuit. Internal driver circuitry of the integrated circuit can drive the gate terminal of the transistor.

In some cases, it is possible that a fault condition may occur at the driver channel. Such fault conditions can include open load conditions or short-circuit conditions. Accordingly, some integrated circuits have included off-state diagnosis circuitry that attempts to detect fault conditions at the driver channels prior to turning on the corresponding transistors and driving the load. However, such off-state diagnosis circuitry typically consumes a large amount of area of the integrated circuit. The result is that valuable integrated circuit area cannot be utilized for the intended function of the integrated circuit.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which, in and of itself, may also be inventive.

BRIEF SUMMARY

Embodiments of the present disclosure provide an integrated circuit including a plurality of driver channels that can be selectively configured as either high side (HS) or low side (LS) channels. The integrated circuit includes off-state diagnosis circuitry that detects fault conditions at the driver channels while the driver channels are off. The off-state diagnosis circuitry includes a counter that is shared by all of the channels. The counter provides timing windows to all of the driver channels for performing off-state diagnosis. Because the counter is shared by all of the driver channels, the off-state diagnosis circuitry consumes only a small amount of integrated circuit area. Furthermore, off-state diagnosis is performed in a highly efficient and effective manner.

Each driver channel includes an internal power transistor having source and drain terminals coupled to the dedicated output terminals of the integrated circuit. Each driver channel also includes a respective analog test circuit and a respective controller coupled to the analog test circuit. All of the controllers are coupled to a single counter. The counter provides the timing windows to the controllers. The controllers then selectively control the analog test circuits to perform off-state diagnosis on the driver channels in accordance with the shared timing windows.

Because each driver channel can either be configured as an HS driver channel or as an LS driver channel, the counter provides timing windows for HS driver channels and timing windows for LS driver channels to all of the controllers. Each controller then selectively controls the corresponding analog test circuit in accordance with either the HS timing windows or the LS timing windows, as the case may be. The result is that off-state diagnosis can be performed for all of the HS driver channels simultaneously and for all the LS driver channels simultaneously. This ensures that off-state diagnosis is performed for all driver channels in a very short amount of time.

In one embodiment, an integrated circuit includes a first driver channel, a second driver channel, and a driver control system. The first driver channel includes a first power transistor and a first output terminal. The second driver channel includes a second power transistor and a second output terminal. The driver control system includes a first analog test circuit coupled to the first output terminal, a second analog circuit coupled to the second output terminal a first controller coupled to the first analog test circuit, a second controller coupled to the second analog test circuit, and a counter coupled to the first controller and the second controller.

In one embodiment, an integrated circuit includes a plurality of driver channels for driving external loads. Each driver channel includes a drain output terminal and a source output terminal. The integrated circuit includes a plurality of analog test circuits each coupled to a respective one of the plurality of driver channels. The integrated circuit includes a counter configured to generate timing windows for each of the plurality of analog test circuits to test the respective one of the plurality of driver channels.

In one embodiment, a method includes generating, with a counter of an integrated circuit, timing windows and providing the timing windows from the counter to a first controller and a second controller of the integrated circuit. The method includes controlling, with the first controller, testing of the first driver channel based on the timing windows and controlling, with the second controller, testing of the second driver channel based on the timing windows.

BRIEF DESCRIPTION OF THE SEVERAL VIEWS OF THE DRAWINGS

Reference will now be made by way of example only to the accompanying drawings. In the drawings, identical reference numbers identify similar elements or acts. In some drawings, however, different reference numbers may be used to indicate the same or similar elements. The sizes and relative positions of elements in the drawings are not necessarily drawn to scale. For example, the shapes of various elements and angles are not necessarily drawn to scale, and some of these elements may be enlarged and positioned to improve drawing legibility.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known systems, components, and circuitry associated with integrated circuits have not been shown or described in detail, to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

Figure 1:
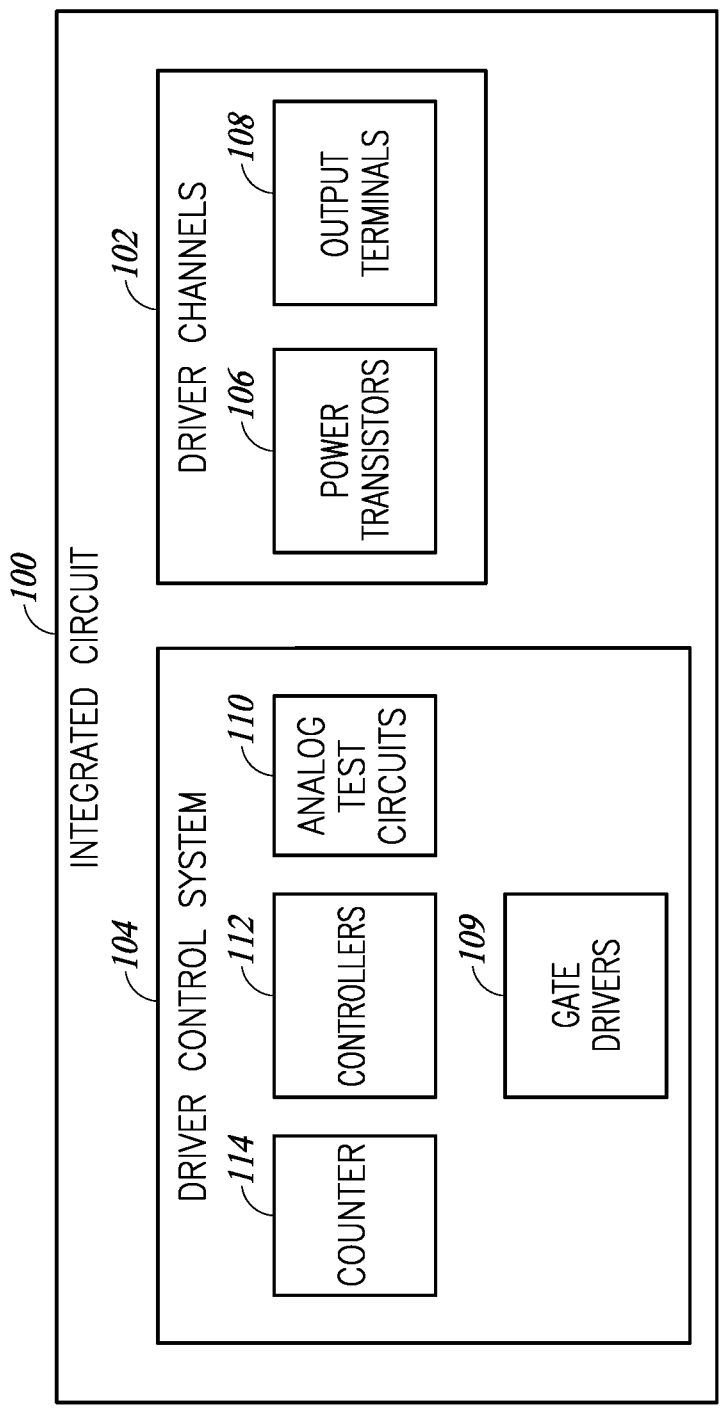
FIG. 1 is a block diagram of an integrated circuit including a plurality of driver channels and a driver control system, according to one embodiment.

FIG. 1 is a block diagram of an integrated circuit 100, according to one embodiment. The integrated circuit 100 includes a plurality of driver channels 102 and a driver control system 104. As will be set forth in more detail below, the driver control system 104 is configured to perform off-state diagnosis on the driver channels 102 in an efficient and effective manner.

Each driver channel 102 includes a respective power transistor and a pair of output terminals 108. The pair of output terminals 108 of the driver channel correspond to output terminals of the integrated circuit 100. The output terminals 108 enable the power transistor 106 to drive a current through a load external to the integrated circuit.

In one embodiment, for each driver channel 102, the power transistor 106 includes a source terminal coupled to one output terminal 108 of the pair of output terminals 108 and a drain terminal coupled to the other of the pair of output terminals 108. Each driver channel 102 can be selectively configured as either an HS driver or an LS driver. In the case of an LS driver, an external load is coupled between an external high voltage source and the drain terminal of the power transistor 106. The source terminal is coupled to ground. In the case of an HS driver, the drain terminal of the power transistor 106 is coupled to an external high voltage source and the external load is coupled between the source terminal and ground.

The driver control system 104 controls the driver channels 102. In particular, the control system receives 104 input data indicating, for each driver channel 102, whether the driver channel 102 is configured as an HS driver channel, an LS driver channel, or is not connected for operation. The driver control system 104 drives the gate terminals of the power transistors 106 in accordance with the corresponding connection scheme to drive currents through the external loads.

The driver control system 104 also performs off-state diagnosis procedures on each of the driver channels 102 prior to driving the gate terminals of the power transistors 106. The off-state diagnosis detects whether or not there are faults present at the driver channels 102. The faults can include short circuit faults and open load faults. The driver control system 104 can detect other types of faults without departing from the scope of the present disclosure.

The driver control system 104 includes, for each driver channel 102, a respective gate driver 109. The gate drivers 109 each selectively drive the gate terminal of the corresponding power transistor 106. Accordingly, the gate drivers 109 apply voltages to the gate terminals of the power transistors 106.

The driver control system 104 includes, for each driver channel 102, a respective analog test circuit 110. Each analog test circuit 110 performs off-state diagnosis procedures for the corresponding driver channel 102. Each analog test circuit 110 is coupled to the pair of output terminals 108 of the respective driver channel 102. The analog test circuits 110 can drive one or more tests currents and can then detect the voltages that appear at the output terminals 108 in order to determine whether or not the fault is present. In some cases, driving a first test current determines whether there is a fault present. If the fault is present after driving the first current, then the analog test circuit 110 drives a second current. The voltage present at the output terminals 108 while driving the second current determines which type of fault is present. Further details regarding the analog test circuits 110 and regarding the timing of the analog test circuits 110 will be provided below. Various schemes and circuit structures can be utilized for the analog test circuits 110 without departing from the scope of the present disclosure.

The driver control system 104 includes, for each driver channel 102, a respective controller 112. Each controller 112 is coupled to the analog test circuit 110 associated with the respective driver channel 102. The controller 112 can control the analog test circuit 110. Each controller 110 stores information indicating whether the corresponding driver channel is configured as an LS driver, an HS driver, or is not coupled for operation. If the corresponding driver channel 102 is not coupled for operation, then the controller 110 may not cause the analog test circuit 110 to perform off-state diagnosis procedures. If the corresponding driver channel 102 is configured as an HS driver channel, then the controller 112 controls the analog test circuit 110 to perform HS off-state diagnosis procedures. If the corresponding driver channel 102 is configured as an LS driver channel, then the controller 112 controls the analog test circuit 110 to perform LS off-state diagnosis procedures.

Each controller 112 can interpret the signals received from the analog test circuit 110. The controller 112 can determine whether or not a fault is present, and what type of fault is present, based on the signals provided by the analog test circuit 110. The timing associated with performing off-state diagnosis procedures will be described in more detail below.

Each controller 112 is coupled to the corresponding gate driver 109 of the respective driver channel 102. The controller 112 controls the gate driver 109 to drive the gate terminal of the corresponding power transistor 106. If the off-state diagnosis indicates that there is a fault present, then the fault information is recorded in a register.

The driver control system 104 includes a counter 114. The counter 114 is coupled to each of the controllers 112. The counter 114 provides timing windows to the controllers 112 for performing off-state diagnosis. The counter 114 provides timing windows for both HS and LS off-state diagnosis to each of the controllers 112. As each controller 112 is coupled to a driver channel 102 configured as either an LS channel or an HS channel, each controller 112 coupled to an LS channel can ignore the HS timing windows, and each controller 112 coupled to an HS channel can ignore the LS timing windows.

As described herein, a timing window may correspond to a duration for which a particular test current is driven by an analog test circuit 110. In one example, there are two HS test currents and two LS tests currents. Accordingly, the HS timing windows include a first duration for the first HS test current and a second duration for the second HS test current. The LS timing windows include a first duration for the first LS timing window and a second duration for the second LS timing window.

Because the counter 114 provides all of the timing windows to each of the controllers 112 simultaneously, very little integrated circuit area is consumed for circuitry directed to generating timing windows for the various driver channels 102. Additionally, because the timing windows are provided from a single counter 114 to all the controllers 112 simultaneously, the off-state diagnosis for each driver channel 102 can be performed substantially simultaneously. In one embodiment, the off-state diagnosis for the HS driver channels is performed simultaneously before or after the simultaneous off-state diagnosis for LS drivers.

Figure 2:
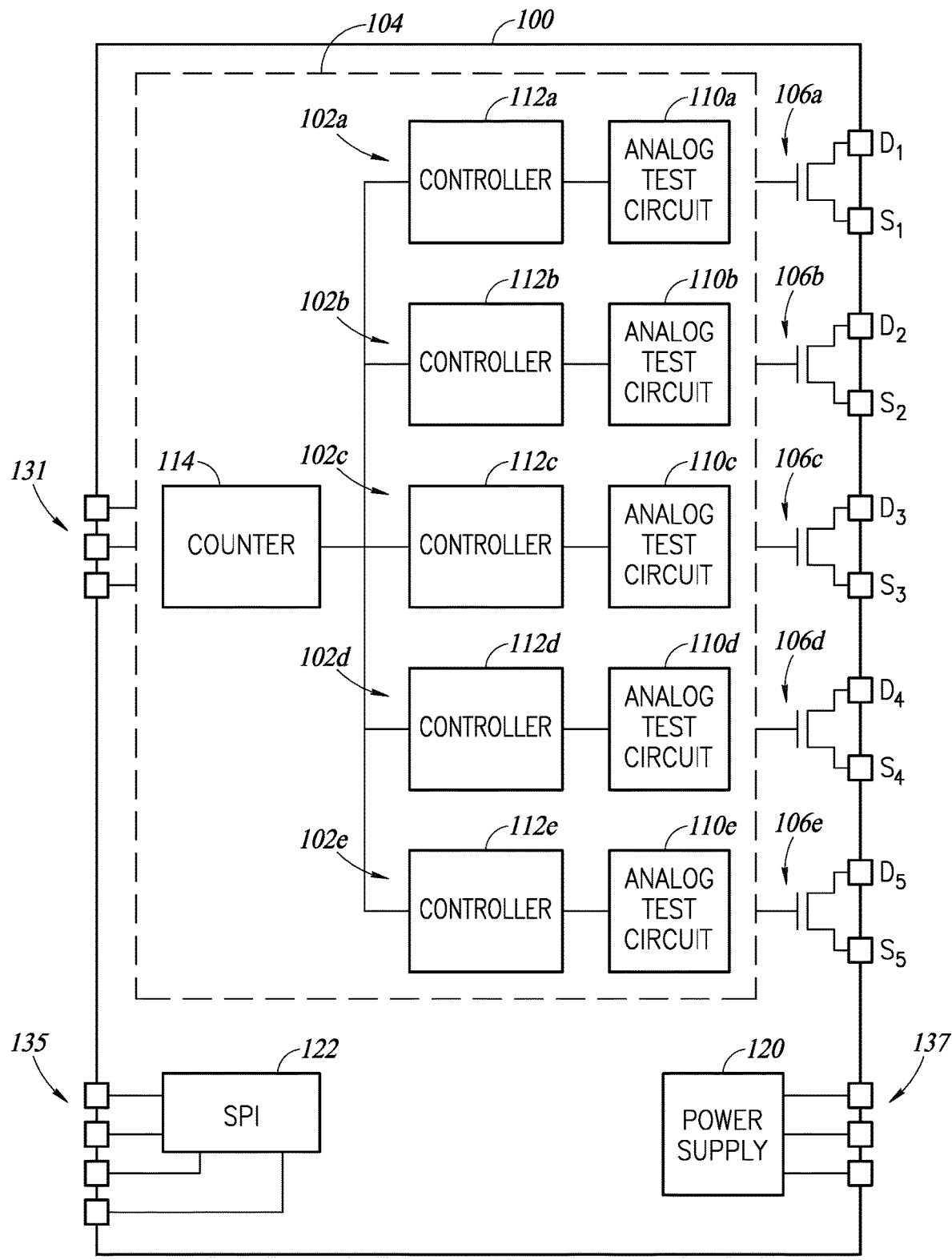
FIG. 2 is a block diagram of an integrated circuit, according to one embodiment.

FIG. 2 is a block diagram of an integrated circuit 100, according to one embodiment. The FIG. 2, the integrated circuit 100 includes five driver channels 102a-102e. Each driver channel 102a-e includes a respective power transistor 106a-e. Each driver channel 102a-e also includes a drain output terminal D1-D5 and a source output terminal S1-S5. The drain output terminals D1-D5 are each coupled to a drain terminal of the corresponding power transistor 106a-e. The source output terminals S1-S5 are each coupled to the source terminal of the corresponding power transistor 106a-e.

Each of the driver channels 102a-e can be configured as either an HS or an LS driver channel. If a driver channel is configured as an HS driver channel, then an external load will be coupled between the source output terminal and ground and the drain output terminal will be coupled to an external high voltage source, such as a high-voltage battery. If a driver channel is configured as an LS channel, then an external load will be coupled between the external high voltage source and the drain terminal and the source terminal will be coupled to ground. In the examples given herein, each of the power transistors 106a-e are N-type power MOSFETs. Alternatively, one or more of the power transistors can include P-type power MOSFETs. The power transistors can include other types of transistors than MOSFETs without departing from the scope of the present disclosure.

The integrated circuit 100 includes a driver control system 104. The driver control system 104 includes, for each driver channel 102a-e, a respective analog test circuit 110a-e. The driver control system 104 includes, for each driver channel 102a-e, a respective controller 112a-e coupled to the corresponding analog test circuit 110a-e. The driver control system 104 also includes a counter 114. The counter 114 is coupled to each of the controllers 112a-e. The driver control system 104 also includes gate drivers (not shown) each configured to drive a date of the respective power transistor 106a-e. The driver control system 104 of FIG. 2 can function substantially as described in relation to FIG. 1.

The integrated circuit 100 includes a plurality of terminals 131 coupled to the driver control system 104. In the example FIG. 2 there are three terminals 131 coupled to the driver control system 104. However, the integrated circuit 100 may include a different number of terminals 131 than are shown in FIG. 2. The terminals 131 may include idle command terminals, input terminals, output terminals, or other types of terminals.

The integrated circuit 100 includes a power supply module 120 and a plurality of terminals 137 coupled to the power supply 120. The terminals 137 may receive a supply voltage VDD, a ground voltage, and the external high supply voltage. The external high supply voltage is also the voltage utilize externally in driving the loads for each of the driver channels 102a-c. The power supply 120 applies the various voltages to appropriate circuits within the integrated circuit 100. There may be a different number of terminals 137 than shown in FIG. 2 without departing from the scope of the present disclosure.

The integrated circuit 100 includes a serial peripheral interface (SPI) block 122. The integrated circuit 100 includes a plurality of terminals 135 coupled to the SPI block 122. The terminals 135 can include data input terminals, data output terminals, clock terminals, or other types of terminals. The integrated circuit 100 can include a different number of terminal than are shown in FIG. 2 without departing from the scope of the present disclosure. The SPI block can store data related to the fault state and the type of fault state of each driver channel. The SPI block 122 can output data, signals, or alerts related to the state of each driver channel.

Figure 3:
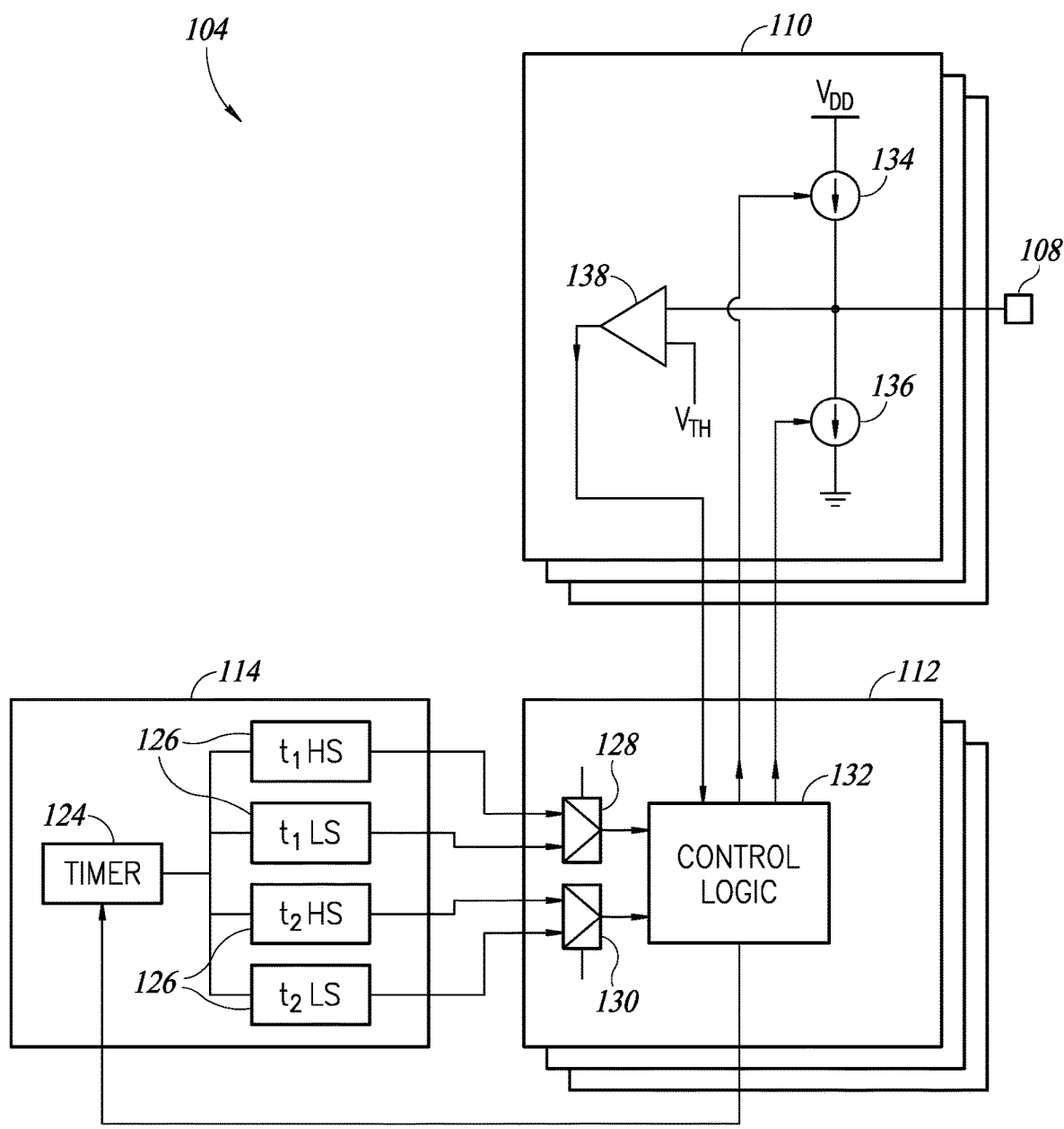
FIG. 3 is a schematic diagram of a driver control system, according to one embodiment.

FIG. 3 is a block diagram of a driver control system 104, according to one embodiment. The driver control system 104 is one example of a driver control system 104 of FIG. 1 or 2. The driver control system 104 includes a plurality of analog test circuits 110. Each analog test circuit 110 includes a first current source 134 and a second current source 136. The first current source 134 is coupled between VDD and an output terminal 108 of the corresponding driver channel. The second current source 136 is coupled between the output terminal 108 and ground. The first and second current sources 134 and 136 can be selectively activated and deactivated, as will be described in further detail below. The analog test circuits 110 each include a comparator 138. The comparator 138 includes a first input terminal coupled to the output terminal 108 and, correspondingly, to the node between the first and second current sources 134 and 136. A second input terminal of the comparator 138 receives a threshold voltage Vth. Operation of the analog test circuit 110 will be described further below.

The driver control system 104 includes a plurality of controllers 112 each coupled to a respective analog test circuit 110. Each controller 112 includes a first relay 128 and a second relay 130. The first relay 128 receives timing windows for the first test phases for both HS and LS off-state diagnostics. The second relay 130 receives timing windows for the second test phases for both HS and LS off-state diagnostics. The relays 128 and 130 receive control signals that determine whether they will pass the HS or LS timing windows.

Each controller 112 includes a respective control logic 132. The control logic 132 may also be termed a control circuit. The control logic 132 receives the timing windows from the relays 128 and 130. The control logic 132 stores data indicating whether the corresponding driver channel 102 (not shown in FIG. 3) is configured as an HS driver channel, and LS driver channel, or not currently configured for operation. The control logic 132 provides the control signals to the relays 128 and 130 that determine whether HS or LS timing windows will be provided to the control logic 132 based on the current configuration of the corresponding driver channel 102. The control circuit 132 provides control signals to the current sources 134 and 136 in accordance with the timing windows, as will be explained in greater detail below. The control circuit 132 also receives the output of the comparator 138. The control circuit 132 determines whether a fault state is present, and what kind of fault state is present, based on the output of the comparator 138, as will be described in greater detail below.

The driver control system 104 also includes a counter 114. The counter 114 includes a timer 124 and timing blocks 126. The timer 124 outputs timing signals, such as a current clock cycle count, to the timing blocks 126. One of the timing blocks 126 provides to the relay 128 a timing window signal T1HS. The timing window signal T1HS indicates the timing and duration for a first phase of HS off-state diagnostics. One of the timing blocks 126 provides to the relay 128 a timing window signal T1LS. The timing window signal T1LS indicates the timing and duration for a first phase of LS off-state diagnostics. One of the timing blocks 126 provides to the relay 130 a timing window signal T2HS. The timing window signal T2HS indicates the timing and duration for the second phase of HS off-state diagnostics. One of the timing blocks 126 provides to the relay 130 a timing window signal T2LS. The timing window signal T2LS indicates the timing and duration of the second phase of LS off-state diagnostics. The timer 124 may be controlled by the control logic 132.

The timer 124 may output a signal indicating a current number of clock cycles that has been counted. Each of the timing blocks 126 may be configured to begin outputting a timing beginning at a particular number of clock cycles and ending at a particular number of clock cycles. The beginning and ending number of clock cycles determine the start time and the total duration of timing windows for the various HS and LS testing phases.

In one embodiment, the current source 134 is a pull-up current source and the current source 136 is a pull-down current source. When activated, the current source 134 drives a current from the supply voltage VDD. When activated, the current source 136 drives a current to ground.

For a LS driver channel, the control logic 132 causes the relay 128 to pass the timing window signal T1LS to the control logic 132. The control logic 132 causes the relay 130 to pass the timing window signal T2LS. In one embodiment, in an LS off-state diagnosis process, the control logic 132 causes the pull-down current source 136 to activate during the timing window T1LS. After T1LS is finished, the control logic 132 turns off the pull-down current source 136 and turns on the pull-up current source 134 for the duration of the timing window T2LS. As will be set forth in more detail below, the control logic 132 determines whether a fault is present based on the output of the comparator 138 during or at the end of the timing window T1LS. The control logic 132 determines what type of fault is present based on the output of the comparator 138 during or at the end of the timing window T2LS. Various other schemes for determining whether there is a fault and what type of fault is present can be utilized without departing from the scope of the present disclosure.

For an HS driver channel, the control logic 132 causes the relay 128 to pass the timing window signal T1HS to the control logic 132. The control logic 132 causes the relay 130 to pass the timing window signal T2HS to the control logic 132. In one embodiment, in an HS off-state diagnosis process, the control logic 132 causes the pull-up current source 134 to activate during the timing window T1HS. After T1HS is finished, the control logic 132 turns off the pull-up current source 134 and turns on the pull-down current source 136 for the duration of the timing window T2HS. As will be set forth in more detail below, the control logic 132 determines whether fault is present based on the output of the comparator 138 during or at the end of the timing window T1HS. The control logic 132 determines what type of fault is present based on the output of the comparator 138 during or at the end of the timing window T2HS. Various other schemes for determining whether there is a fault and what type of fault is present can be utilized without departing from the scope of the present disclosure.

Figure 4A:
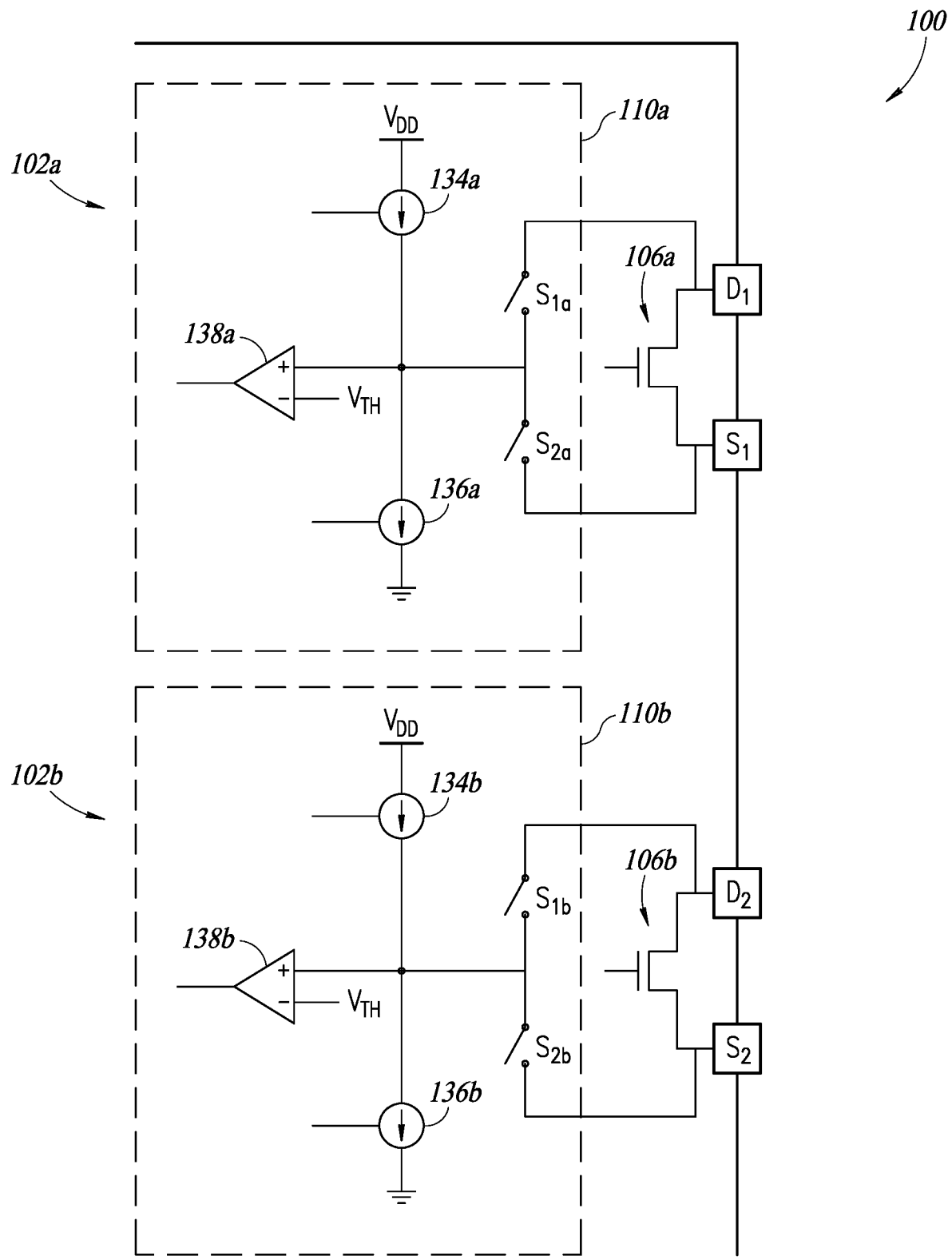
FIGS. 4A and 4B are schematic diagrams of an integrated circuit, according to one embodiment.

FIG. 4A illustrates a portion of an integrated circuit 100, according to one embodiment. FIG. 4A illustrates two driver channels 102a and 102b. In FIG. 4A, the two driver channels 102a and 102b are substantially identical. Accordingly, only description of the driver channel 102a will be provided in relation to FIG. 4A.

The driver channel 102a includes a power transistor 106a. The power transistor 106a has a drain terminal coupled to the drain output terminal D1 of the integrated circuit 100 and a source terminal coupled to the source output terminal S1 of the integrated circuit 100. The driver channel 102a includes the analog test circuit 110a. The analog test circuit 110a is substantially similar to the analog test circuits 110 described in relation to FIG. 3. However, FIG. 4A illustrates one embodiment of how the analog test circuit 110a can be selectively connected to perform off-state diagnosis on either an LS connection or an HS connection. The driver channel 102a includes switches S1a and S2a. The logic circuit 132 selectively closes the switch S1a and opens the switch S2a for off-state diagnosis when the driver channel 102a is configured as an LS driver channel. The logic circuit 132 selectively opens the switch S1a and closes the switch S2a for off-state diagnosis when the driver channel 102a is configured as an HS driver channel.

Figure 4B:
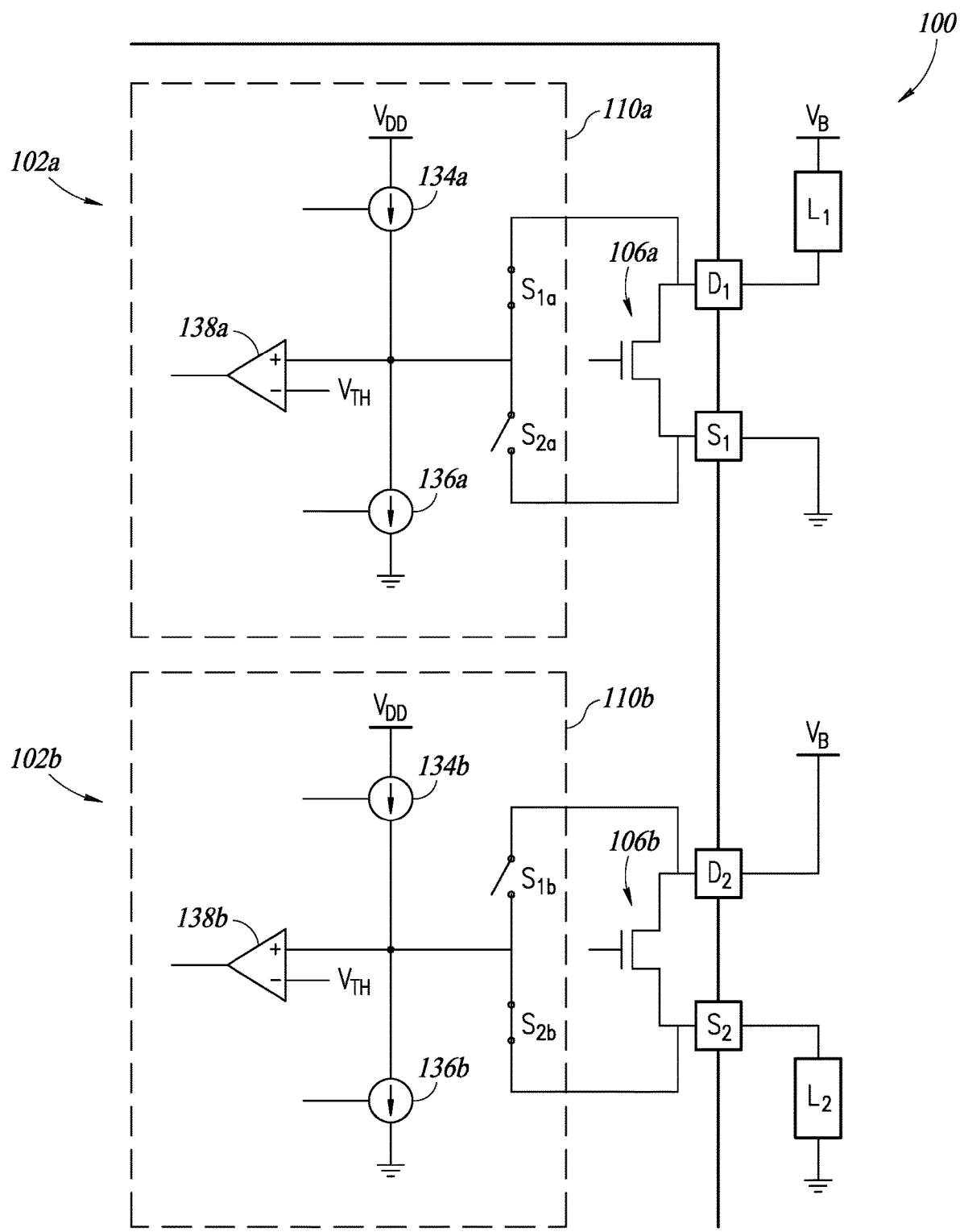

FIG. 4B illustrates the integrated circuit 100 of FIG. 4A with the driver channel 128 configured as an LS driver channel and the driver channel 102b configured as an HS driver channel. For the driver channel 102a configured as an LS driver channel, an external load L1 is connected between a high voltage battery Vb and the drain output terminal D1. The source output terminal S1 is connected to ground. The switch S1a is closed and the switch S2a is open in preparation for performing off-state diagnosis.

For the driver channel 102b configured as an HS driver channel, an external load L2 is connected between the source output terminal S2 and ground. The drain output terminal D2 is coupled to the high voltage battery Vb. The switch S1b is open in the switch S2b is closed in preparation for performing off-state diagnosis.

Figure 5A:
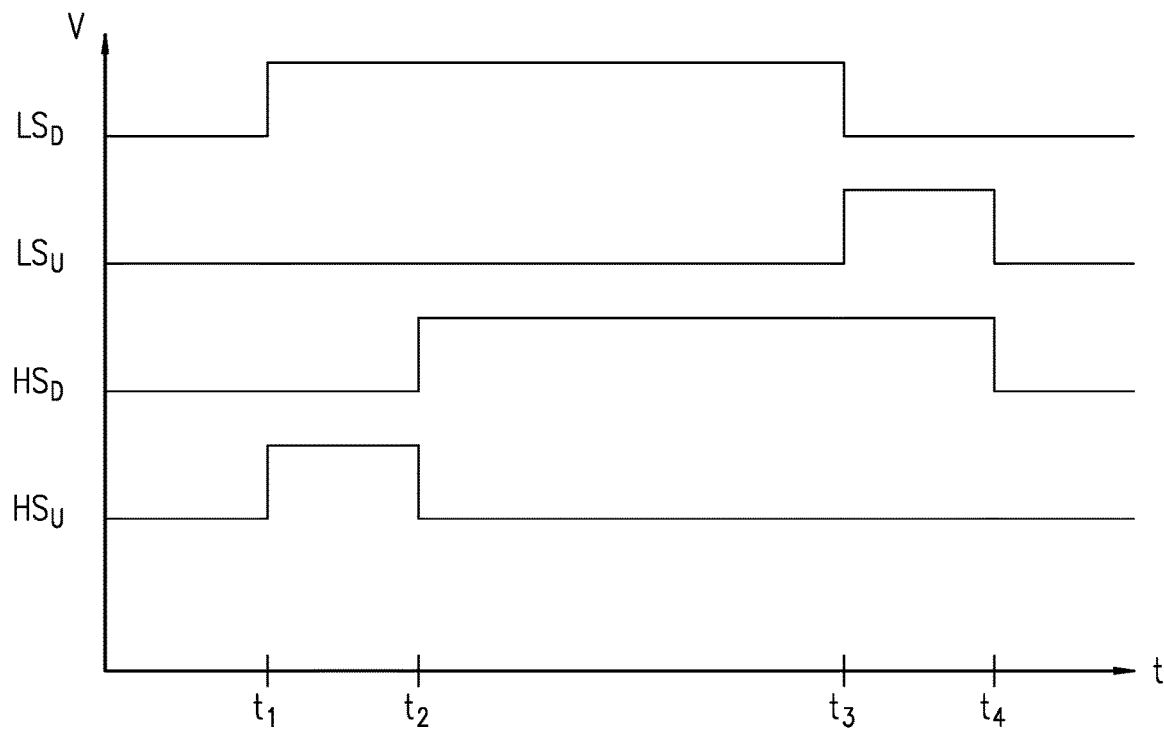
FIG. 5A-5D are graphs illustrating timing windows for performing off-state diagnosis, according to one embodiment.

A description of off-state diagnosis for the LS configured channel 102a and the HS configured channel 102b will be described with reference to FIGS. 5A-5D. FIG. 5A illustrates activation of the pull-up and pulldown current sources 134a,b and 136a,b in conjunction with the timing windows T1LS, T1HS, T2LS and T2HS. The control signal LSD controls the pulldown current source 136a and is high during the timing window T1LS. The control signal LSU controls the pull-up current source 134a and is high during the timing window T2LS. The control signal HSD controls the pulldown current source 136b and is high during the timing window T2HS. The control signal HSU controls the pull-up current source 134b and is high during the timing window T1HS.

At time T1, the timing window T1LS causes the LS pulldown control signal LSD to go high for a first testing phase of the LS configured channel 102a. This causes the pulldown current source 136a to turn on for the LS first testing phase.

At time T1 the timing window T1HS causes the HS pull-up control signal HSU to go high for a first testing phase of the HS configured channel 102b. This causes the pull-up current source 134b to turn on for the HS first testing phase.

At time T2, the first HS testing phase ends and the current source 134b is turned off. At time T2, the second HS testing phase begins and the HS pulldown signal HSD goes high, causing the current source 134b to turn on.

At time T3, the first LS testing phase ends and the current source 136a is turned off. At time T3, the second LS testing phase begins and the LS pull-up signal LSU goes high, causing the pull-up current source 134a to turn on.

As can be seen in FIG. 5A, the pulldown current sources are activated for a longer duration than are the pull-up current sources during off-state diagnosis. In one example, the timing windows T1LS and T2HS the determine the control signals LSD and HSD, respectively, have a duration between 70 and 80 clock cycles counted by the counter 114. In one example, the timing windows T2LS and T1HS have a duration between 15 and 25 clock cycles counted by the counter 114. In one example, the timing windows T1LS and T2HS the determine the control signals LSD and HSD, respectively, have a duration between 0.8 ms and 1.2 ms. In one example, the timing windows T2LS and T1HS have a duration between 0.1 ms and 0.5 ms. Other durations can be utilized without departing from the scope of the present disclosure.

Figure 5B:
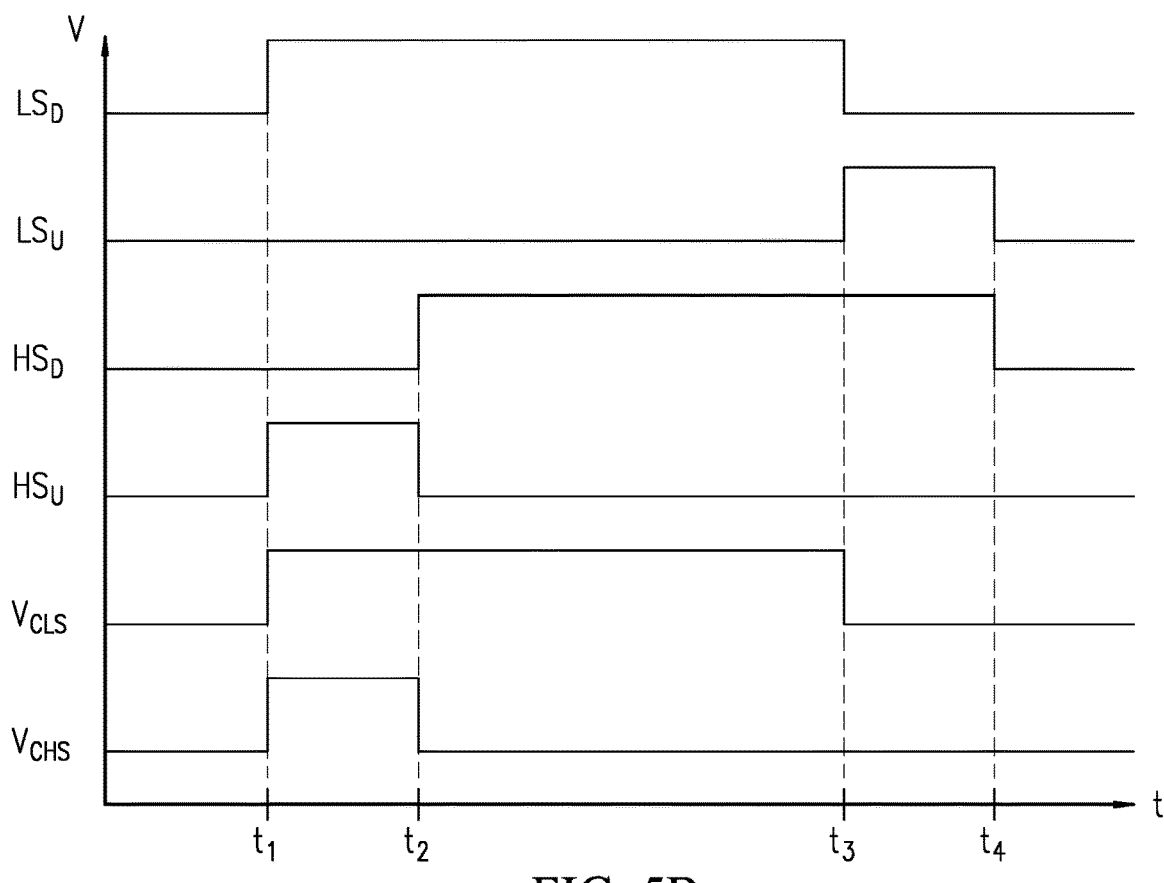

FIG. 5B illustrates a test case in which both the driver channels 102a and 102b are in an open load fault state. In FIG. 5B, VCLS corresponds to the output of the comparator 138a. Prior to describing specific case of FIG. 5B, it is beneficial to describe the signals VCHS and VCLS and what they indicate. VCHS corresponds to the output of the comparator 138b. If VCHS goes high during or by the end of the first HS testing phase between T1 and T2, this indicates that the fault is present at the HS configured channel 102b. If VCHS stays low throughout the duration of the first HS testing phase between times T1 and T2, this indicates that the load L1 is present and no fault condition exists. Likewise, if VCLS goes high during or by the end of the first LS testing phase between times T1 and T3, this indicates that a fault is present at the LS configured channel 102a. If VCLS stays low throughout the duration of the first LS testing phase between T1 and T3, this indicates that the load L1 is present and no fault condition exists.

While VCLS going high during the first LS testing phase indicates the presence of a fault, this does not indicate what type of fault is present. The type of fault can be determined by the output of the comparator 138a (signal VCLS) during the second LS testing phase between times T3 and T4 when the pull-up current source 134a is turned on. If the voltage at the drain output terminal D1 remains higher than the threshold voltage Vth while the pull-up current source 134a is active, VCLS remains high and this indicates that the fault is a short to ground fault. If the voltage at the drain output terminal D1 goes below the threshold voltage Vth when the pull-up current source 134a is active, then VCLS goes low in this indicates that the fault is an open load fault.

While VCHS going high during the first HS testing phase indicates the presence of a fault, this does not indicate what type of fault is present. The type of fault can be determined by the output of the comparator 138b (VCHS) during the second HS testing phase between times T2 and T4 when the pulldown current source 136b is turned on. If the voltage at the source output terminal S2 remains higher than the threshold voltage Vth while the pulldown current source 136b is active, the CLS remains high in this indicates that the fault is a short battery. If the voltage at the source output terminal S2 goes below the threshold voltage Vth each when the pulldown current source 134b is active, then VCHS goes low and this indicates that the fault is an open load fault.

In FIG. 5B, VCLS has gone high during the first LS testing phase between T1 and T3. This means that while the current source 136a was turned on, the voltage at the drain terminal D1 went higher than the threshold voltage Vth, indicating the presence of a fault. During the second testing phase between times T3 and T4, VCLS went low, indicating that the fault is an open load fault.

In FIG. 5B, VCHS has gone high during the first HS testing phase between times T1 and T2. This means that while the current source 134b was turned on, the voltage at the source terminal S2 went higher than the threshold voltage Vth, indicating the presence of a fault. During the second testing phase between times T2 and T4, VCHS went low, indicating that the fault is an open load fault.

Figure 5C:
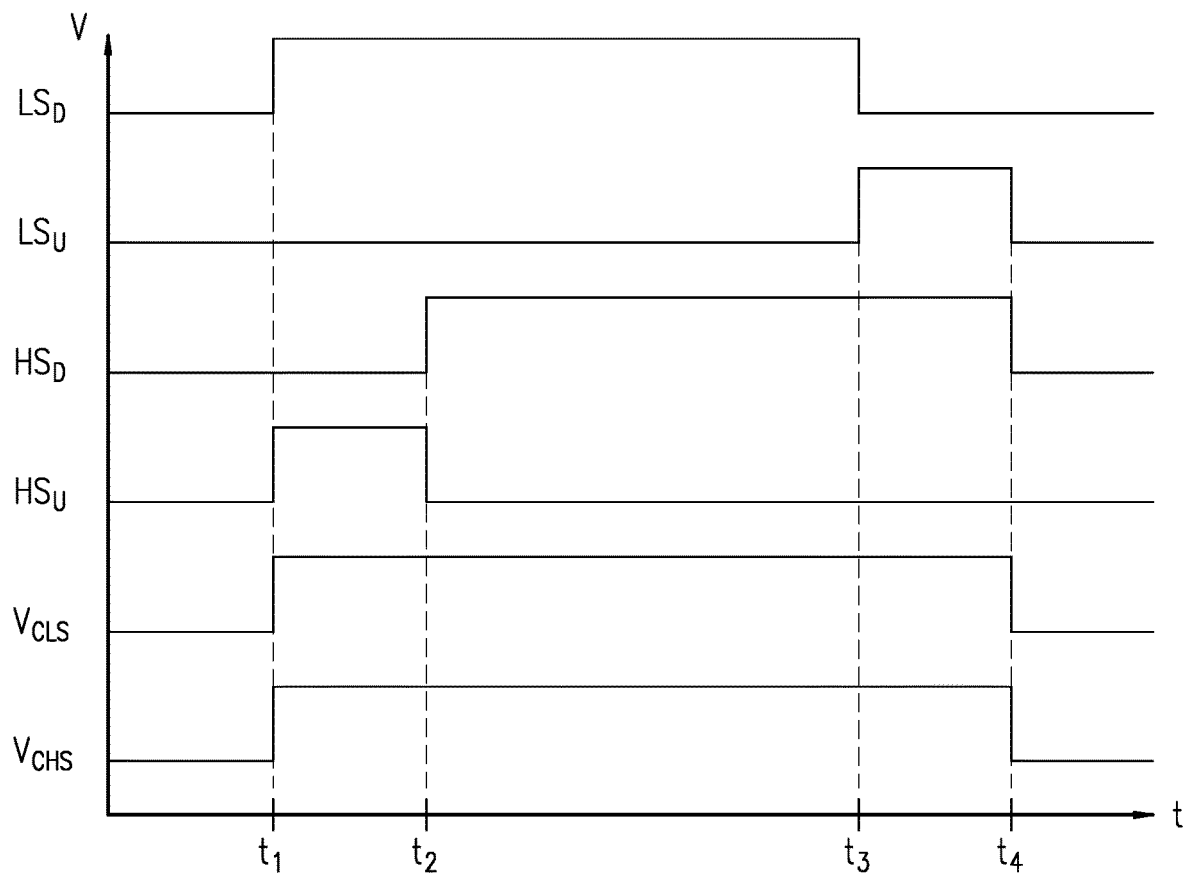

In FIG. 5C, VCLS has gone high during the first LS testing phase between T1 and T3. This means that while the current source 136a was turned on, the voltage at the drain terminal D1 went higher than the threshold voltage Vth, indicating the presence of a fault. During the second testing phase between times T3 and T4, VCLS remained high, indicating that the fault is a short to ground fault.

In FIG. 5C, VCHS has gone high during the first HS testing phase between times T1 and T2. This means that while the current source 134b was turned on, the voltage at the source terminal S2 went higher than the threshold voltage Vth indicating the presence of a fault. During the second testing phase between times T2 and T4, VCHS remained high, indicating that the fault is a short to battery.

Figure 5D:
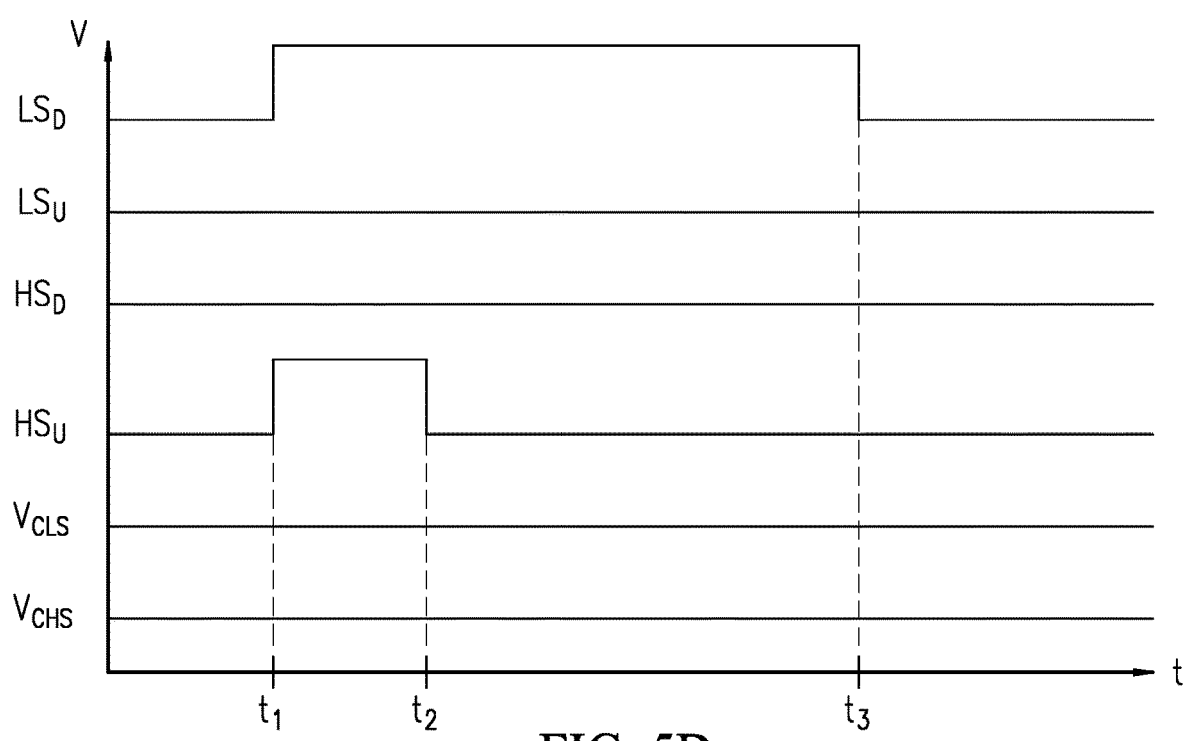

In FIG. 5D, both VCLS and VCHS remained low during the first HS and LS testing phases. This indicates that no fault was present on either channel. Because the control logic 132 determines that no fault is present on either channel, the second LS and HS testing phases are not performed.

In one embodiment, the control logic 132 records whether fault is present and what type of fault is present based on the results of the off-state diagnosis tests. If a fault is present, the control logic 132 can output an indication to systems external to the integrated circuit 100 that a fault is present. Furthermore, the control logic 132 disables any driver channel at which a fault is present.

In FIGS. 5A and 5D, the HS and LS testing was performed simultaneously. However, in some embodiments, the HS and LS testing can be performed simultaneously. Both HS testing phases can be performed for all HS configured driver channels and then both LS testing phases can be performed for all LS configured driver channels. Alternatively, the LS testing phases can be performed before the HS testing phases.

Figure 6:
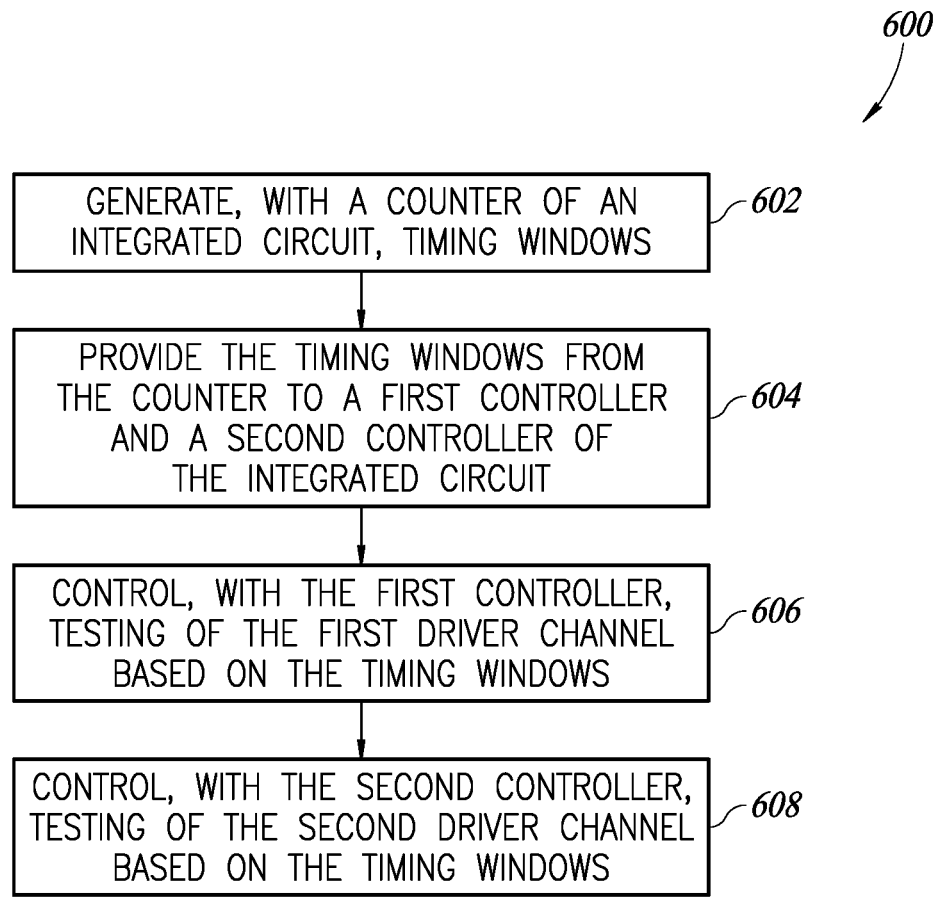
FIG. 6 is a flow diagram of a method for operating an integrated circuit, according to one embodiment.

FIG. 6 is a flow diagram of a method 600 for performing off-state diagnosis on driver channels of the integrated circuit, according to one embodiment. The method 600 can utilize components, systems, and processes described in relation to FIGS. 1-5D. At 602, the method 600 includes generating, with a counter of an integrated circuit, timing windows. At 604, the method 600 includes providing the timing windows from the counter to a first controller and a second controller of the integrated circuit. At 606, the method 600 includes controlling, with the first controller, testing of the first driver channel based on the timing windows. At 608, the method 600 includes controlling, with the second controller, testing of the second driver channel based on the timing windows.

In one embodiment, an integrated circuit includes a first driver channel, a second driver channel, and a driver control system. The first driver channel includes a first power transistor and a first output terminal. The second driver channel includes a second power transistor and a second output terminal. The driver control system includes a first analog test circuit coupled to the first output terminal, a second analog circuit coupled to the second output terminal a first controller coupled to the first analog test circuit, a second controller coupled to the second analog test circuit, and a counter coupled to the first controller and the second controller.

In one embodiment, an integrated circuit includes a plurality of driver channels for driving external loads. Each driver channel includes a drain output terminal and a source output terminal. The integrated circuit includes a plurality of analog test circuits each coupled to a respective one of the plurality of driver channels. The integrated circuit includes a counter configured to generate timing windows for each of the plurality of analog test circuits to test the respective one of the plurality of driver channels.

In one embodiment, a method includes generating, with a counter of an integrated circuit, timing windows and providing the timing windows from the counter to a first controller and a second controller of the integrated circuit. The method includes controlling, with the first controller, testing of the first driver channel based on the timing windows and controlling, with the second controller, testing of the second driver channel based on the timing windows.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, comprising:
a first driver channel including:
a first power transistor; and
a first output terminal;
a second driver channel including:
a second power transistor; and
a second output terminal; and
a driver control system including:
a first analog test circuit coupled to the first output terminal;
a second analog test circuit coupled to the second output terminal;
a first controller coupled to the first analog test circuit;
a second controller coupled to the second analog test circuit; and
a counter coupled to the first controller and the second controller, the counter configured to generate timing windows for off-state diagnosis for the first and second driver channels,
wherein the timing windows generated by the counter comprise at least a first off-state test phase and a second off-state test phase for each driver channel, and
wherein in the first off-state test phase, the respective analog test circuit detects whether a fault is present in the corresponding driver channel, and in the second off-state test phase, the respective analog test circuit identifies a type of fault when the fault is detected.

2. The integrated circuit of claim 1, wherein the counter provides, to the first controller and the second controller, a plurality of timing signals, wherein the first controller is configured to control the first analog test circuit to perform off-state diagnosis for the first driver channel in accordance with the timing signals, wherein the second controller is configured to control the second analog test circuit to perform off-state diagnosis for the first driver channel in accordance with the timing signals.

3. The integrated circuit of claim 2, wherein the first analog test circuit includes a first comparator having an input coupled to the first output terminal and an output coupled to the first controller, wherein the second analog test circuit includes a second comparator having an input coupled to the second output terminal and an output coupled to the second controller.

4. The integrated circuit of claim 3, wherein the timing signals include timing windows for both low-side driver configurations and for high-side driver configurations.

5. The integrated circuit of claim 3, wherein the first comparator is configured to output fault signals to the first controller indicating whether or not a fault is present at the first driver channel.

6. The integrated circuit of claim 4, wherein the first analog test circuit includes:
a first current source coupled between a high supply voltage and the first output terminal; and
a second current source coupled between the first output terminal and ground, wherein the first controller selectively activates and deactivates the first and second current source during off-state diagnosis.

7. An integrated circuit, comprising:
a plurality of driver channels for driving external loads, each driver channel including:
a drain output terminal; and
a source output terminal;
a plurality of analog test circuits each coupled to a respective one of the plurality of driver channels; and
a counter configured to generate timing windows for each of the plurality of analog test circuits to perform off-state diagnosis of the respective one of the plurality of driver channels, wherein the timing windows generated by the counter comprise at least a first off-state test phase and a second off-state test phase for each driver channel, and wherein during the first off-state test phase, the respective analog test circuit detects whether a fault is present at its corresponding driver channel, and during the second off-state test phase, the respective analog test circuit determines a type of the fault upon detection.

8. The integrated circuit of claim 7, comprising a plurality of controllers each coupled to the counter and to a respective analog test circuit and configured to control the analog test circuit to perform testing operations based on the timing windows generated by the counter.

9. The integrated circuit of claim 8, wherein each driver channel can be selectively configured as a high side driver channel or a low side driver channel, wherein each controller is configured to selectively cause the corresponding analog test circuit to perform a low side testing operation or a high side testing operation depending on whether the corresponding driver channel is configured as a high side driver channel or a low side driver channel.

10. The integrated circuit of claim 9, wherein each analog test circuit includes a comparator, wherein the corresponding controller is configured to couple an input terminal of the comparator to the drain output terminal of the corresponding driver channel when the driver channel is configured as a low side driver, and to couple the input terminal of the comparator to the source output terminal of the corresponding driver channel when the driver channel is configured as a high side driver.

11. The integrated circuit of claim 9, wherein the timing windows include high side timing windows and low side timing windows, wherein each controller is configured control the corresponding analog test signal based on the high side timing windows if the corresponding driver channel is configured as a high side driver channel and to control the corresponding analog test signal based on the low side timing windows if the corresponding driver channel is configured as a low side driver channel.

12. The integrated circuit of claim 11, wherein the high side timing windows include high side pull-up windows and high side pull-down windows, wherein the low side timing windows include low side pull-up windows and low side pull-down windows.

13. The integrated circuit of claim 12, wherein each analog test circuit is configured to identify whether or not there is a fault present at the corresponding driver channel, and, if a fault is present, to identify whether the fault is an open load fault or short circuit fault.

14. The integrated circuit of claim 13, wherein each driver channel includes a respective power transistor having:
a drain terminal coupled to the drain output terminal; and
a source terminal coupled to the source output terminal.

15. A method, comprising:
generating, with a counter of an integrated circuit, timing windows for off-state diagnosis;
providing the timing windows from the counter to a first controller and a second controller of the integrated circuit;
controlling, with the first controller, testing of a first driver channel of the integrated circuit based on the timing windows; and
controlling, with the second controller, testing of a second driver channel of the integrated circuit based on the timing windows,
wherein the timing windows include at least a first off-state test phase and a second off-state test phase for each driver channel,
wherein during the first off-state test phase, the respective driver channel is tested to detect whether a fault is present, and during the second off-state test phase, the respective driver channel is tested to determine a type of fault when a fault is detected.

16. The method of claim 15, wherein the timing windows include first timing windows and second timing windows, the method comprising:
controlling, with the first controller, testing of the first driver channel based on the first timing windows; and
controlling, with the second controller, testing of the second driver channel based on the second timing windows.

17. The method of claim 15, wherein the integrated circuit includes:
a first analog test circuit coupled to the first controller and to the first driver channel; and
a second analog test circuit coupled to the second controller and to the second driver channel.

18. The method of claim of claim 17, wherein controlling testing of first driver channel includes controlling the first analog test circuit coupled to the first driver channel.

19. The method of claim 18, comprising:
receiving, for the first driver channel, data indicating whether the first driver channel is currently configured as a high side driver channel or a low side driver channel; and
controlling, with the first controller, testing of the first driver channel based on the data.

20. The method of claim 19, wherein generating the timing windows includes generating high side timing windows and low side timing windows.

* * * * *